(12) United States Patent
Bobde et al.

(10) Patent No.: US 9,876,096 B2
(45) Date of Patent: Jan. 23, 2018

(54) INTEGRATING ENHANCEMENT MODE DEPLETED ACCUMULATION/INVERSION CHANNEL DEVICES WITH MOSFETS

(71) Applicant: Alpha and Omega Semiconductor Incorporated, Sunnyvale, CA (US)

(72) Inventors: Madhur Bobde, San Jose, CA (US); Sik Lui, Sunnyvale, CA (US); Hamza Yilmaz, Saratoga, CA (US); Jongoh Kim, Portland, OR (US); Daniel Ng, Campbell, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/336,636

(22) Filed: Oct. 27, 2016

(65) Prior Publication Data

US 2017/0047431 A1    Feb. 16, 2017

Related U.S. Application Data

(62) Division of application No. 14/565,668, filed on Dec. 10, 2014, now Pat. No. 9,484,452.

(51) Int. Cl.
*H01L 21/336*    (2006.01)
*H01L 29/66*    (2006.01)
(Continued)

(52) U.S. Cl.
CPC .... *H01L 29/66734* (2013.01); *H01L 29/0623* (2013.01); *H01L 29/0696* (2013.01);
(Continued)

(58) Field of Classification Search
CPC .......... H01L 29/66734; H01L 29/0696; H01L 29/7828; H01L 29/66666; H01L 29/0623;
(Continued)

(56) References Cited

U.S. PATENT DOCUMENTS 8,431,470 B2 * 4/2013 Lui ..................... H01L 27/0629
257/284
8,476,698 B2 7/2013 Guan et al.
(Continued)

OTHER PUBLICATIONS

Non-Final Office Action for U.S. Appl. No. 14/565,668, dated Feb. 25, 2016.

*Primary Examiner* — Anthony Ho
(74) *Attorney, Agent, or Firm* — JDI Patent; Joshua D. Isenberg; Robert Pullman

(57) ABSTRACT

A plurality of gate trenches is formed into an epitaxial region of a first conductivity type over a semiconductor substrate. One or more contact trenches are formed into the epitaxial region, each between two adjacent gate trenches. One or more source regions of the first conductivity type are formed in a top portion of the epitaxial region between a contact trench and a gate trench. A barrier metal is formed inside each contact trench.
Each gate trench is substantially filled with a conductive material separated from trench walls by a layer of dielectric material to form a gate . A heavily doped well region of a conductivity opposite the first type is provided in the epitaxial region proximate a bottom portion of each of the contact trenches. A horizontal width of a gap between the well region and the gate trench is about 0.05 μm to 0.2 μm.

8 Claims, 13 Drawing Sheets

(51) Int. Cl.
*H01L 29/78* (2006.01)
*H01L 29/423* (2006.01)
*H01L 29/08* (2006.01)
*H01L 29/40* (2006.01)
*H01L 29/36* (2006.01)
*H01L 29/417* (2006.01)
*H01L 29/06* (2006.01)
*H01L 29/10* (2006.01)
*H01L 29/872* (2006.01)

(52) U.S. Cl.
CPC ........ *H01L 29/086* (2013.01); *H01L 29/0878* (2013.01); *H01L 29/1095* (2013.01); *H01L 29/36* (2013.01); *H01L 29/407* (2013.01); *H01L 29/41766* (2013.01); *H01L 29/4236* (2013.01); *H01L 29/42356* (2013.01); *H01L 29/66492* (2013.01); *H01L 29/66666* (2013.01); *H01L 29/7806* (2013.01); *H01L 29/7813* (2013.01); *H01L 29/7828* (2013.01); *H01L 29/0619* (2013.01); *H01L 29/4238* (2013.01); *H01L 29/872* (2013.01); *H01L 29/8725* (2013.01)

(58) Field of Classification Search
CPC ................. H01L 29/0619; H01L 29/872; H01L 29/8725
USPC ....................................................... 438/270
See application file for complete search history.

(56) References Cited

U.S. PATENT DOCUMENTS

| | | |
|---|---|---|
| 8,507,978 B2 | 8/2013 | Bhalla et al. |
| 8,698,196 B2 | 4/2014 | Guan et al. |
| 8,710,627 B2 | 4/2014 | Guan et al. |
| 8,772,901 B2 | 7/2014 | Zhu et al. |
| 9,190,512 B2 | 11/2015 | Lee et al. |
| 9,281,368 B1 | 3/2016 | Lee et al. |
| 9,318,587 B2 | 4/2016 | Bobde et al. |
| 9,450,088 B2 | 9/2016 | Lee et al. |
| 9,484,452 B2 | 11/2016 | Bobde et al. |
| 2014/0239388 A1 | 8/2014 | Lee et al. |
| 2014/0319604 A1 | 10/2014 | Bhalla et al. |
| 2016/0197169 A1 | 7/2016 | Bobde et al. |

\* cited by examiner

US 9,876,096 B2

INTEGRATING ENHANCEMENT MODE DEPLETED ACCUMULATION/INVERSION CHANNEL DEVICES WITH MOSFETS

BACKGROUND OF THE INVENTION

1. Field of the Disclosure

Aspects of the present disclosure relate generally to semiconductor power devices, and more particularly, to a power MOSFET with an integrated Accumulation/inversion channel FET and a method of fabricating the same.

2. Description of the Prior Art

Semiconductor devices are frequently used to switch currents in power electronic circuits. One common type of switching devices, for example, is the power MOSFET (metal oxide field effect transistor). Power MOSFETs have been used as synchronous rectifiers to significant improve conduction losses in applications such as DC-DC buck converters or synchronous rectifiers. A conventional buck converter, for example, has a high-side MOSFET as control MOSFET and a low-side MOSFET as synchronous MOSFET. The low-side MOSFET works as a synchronous rectifier because its on-time interval is synchronized to with the body diode conduction time. Generally, the high-side MOSFET is turned on when the low-side MOSFET is turned off and vice-versa. The low-side MOSFET conducts current in its third quadrant ($V_{DS}<0$, $I_D<0$) during the off times of the high-side MOSFET as the load current flows from source to drain.

When the buck converter operates at high speed, a shoot through condition occurs when both the high side and low side MOSFETs are turned on at the same time, causing a shoot through current to flow between the input terminal and the ground terminal. The shoot through condition results in excessive dissipation and efficiency loss. In order to avoid the shoot through problem, a dead time period is provided between the time when the high side MOSFET is turned off and the time when the low side MOSFET is turned on to prevent the high side and low side MOSFETs from turning on simultaneously.

Each of the high side and low side MOSFETs with a normal source-body short contains an intrinsic body diode at the junction between its drain and body regions. During the dead time periods, the inductor current flows through the lower MOSFET's body diode and develops stored charge in the depletion region. This stored charge must be swept out to allow the body diode to recover its forward-blocking characteristic. This body diode usually has a very slow reverse recovery characteristic that can adversely affect the converter's efficiency. Thus, it is desirable to have a diode with low forward bias voltage.

Power MOSFETs that implement P-N junction diodes exhibit several undesirable characteristics, which include: large forward conduction loss, storage of charge between body-epitaxial junction when operating in forward bias, excess stored minority charges which cause large recovery currents and voltage overshoots when the power MOSFET is switched from forward bias to reverse bias, generation of radio frequency interference during fast switching. All of these characteristics cause unnecessary stress to the device, leading to sub-optimal performance.

Schottky diodes have been used to replace P-N junction diodes in many applications, including in power MOSFETs (i.e., MOSFET with body diode in parallel with source and drain). Schottky diodes exhibit several desirable characteristics which make them preferable over P-N diodes, particularly in a power MOSFET configuration. The low forward drop of the Schottky diode during forward conduction reduces power dissipation of the device and leads to lower conduction loss. The conduction of the Schottky is carried out by majority carriers, so minority carrier charge storage effects do not occur during switching of the device. As such, the Schottky diode is preferred in power MOSFET configurations.

As applications of power MOSFETs employing Schottky diodes become more widespread, it becomes even more important to improve the device configuration to reduce productions costs. One particular important consideration is the reduction of surface areas on the semiconductor substrate occupied by the Schottky diodes. Reduction of surface-area utilization of Schottky diodes provides a key to reducing the manufacturing costs and further miniaturizing the size and shape of electronic devices to achieve portability and other functional enhancements.

Therefore, a need still exists in the art of power semiconductor device design and manufacture to provide new device configurations and manufacturing method in integrating $3^{rd}$ quadrant conduction structure in a MOSFET device.

It is within this context that aspects of the present disclosure arise.

SUMMARY OF THE PRESENT INVENTION

It is therefore an aspect of the present disclosure to provide a new and improved device structure and a manufacturing method to form an integrated trenched gate MOSFET and ACCUFET or Depleted Body FET.

Briefly, aspects of the present disclosure include a structure combining one or more field effect transistors and a ACCUFET or Depleted Body FET on a heavily doped semiconductor substrate of a first conductivity type. The structure includes a plurality of gate trenches formed in an epitaxial region of the first conductivity type over the semiconductor substrate. One or more contact trenches are formed into the epitaxial region each provided between two adjacent gate trenches. One or more heavily doped source regions of the first conductivity type are formed in a top portion of the epitaxial region, each provided between a corresponding one of the contact trenches and a corresponding one of the gate trenches. An ohmic contact comprising a barrier metal, metal plug is formed inside each contact trench. Each gate trench is substantially filled with a conductive material that is separated from trench walls of a layer of dielectric material to form a gate region of the one or more field effect transistors. A heavily doped well region of a second conductivity type opposite to the first conductivity type is provided proximate a bottom portion of each of the contact trenches. A horizontal width of a gap between the heavily doped well region and the gate trench may be about 0.05 μm to 0.2 μm.

In some implementations, the structure is characterized by a threshold voltage that ranges from about 0.2 V to about 0.4V.

In some implementations, the one or more field effect transistors are split gate transistors.

In some implementations, a lightly doped region of the second conductivity type is provided in the epitaxial region and between one of the heavily doped well regions and one of the gate trenches. The lightly doped region of the second conductivity type is extended in a depth near a bottom portion of the heavily doped well region.

These and other aspects of the present disclosure will no doubt become obvious to those of ordinary skill in the art

DESCRIPTION OF SPECIFIC EMBODIMENTS

Introduction

Figure 1A:
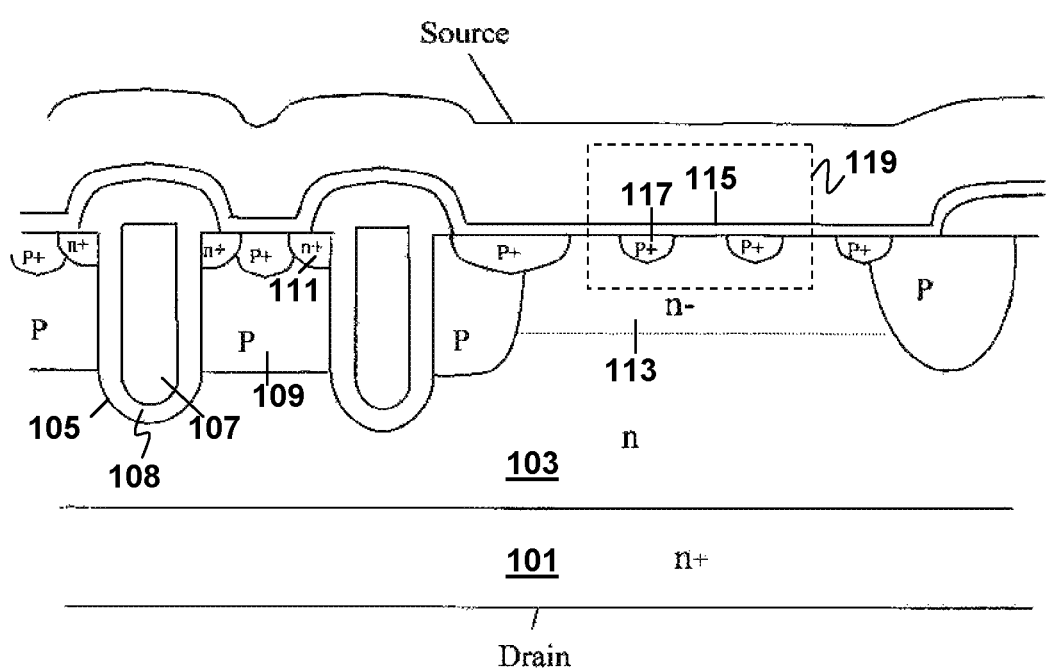
FIGS. 1A-1C are cross-sectional schematic diagrams of prior art integrated structures.
Figure 1B:
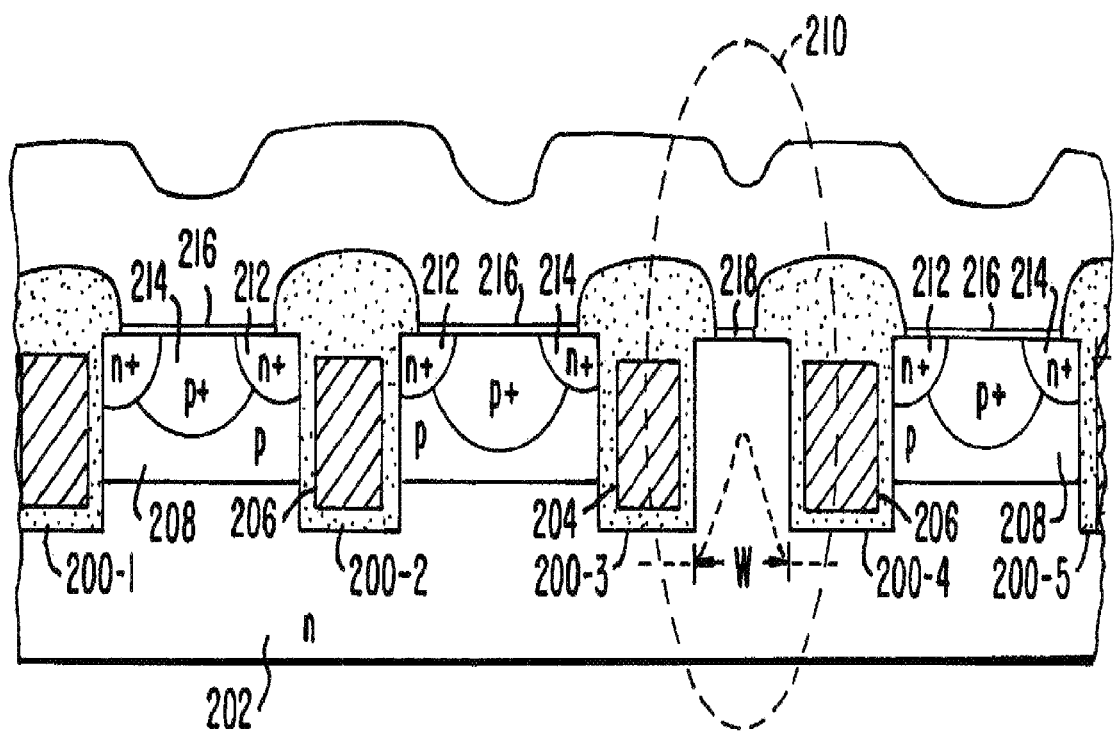
Figure 1C:
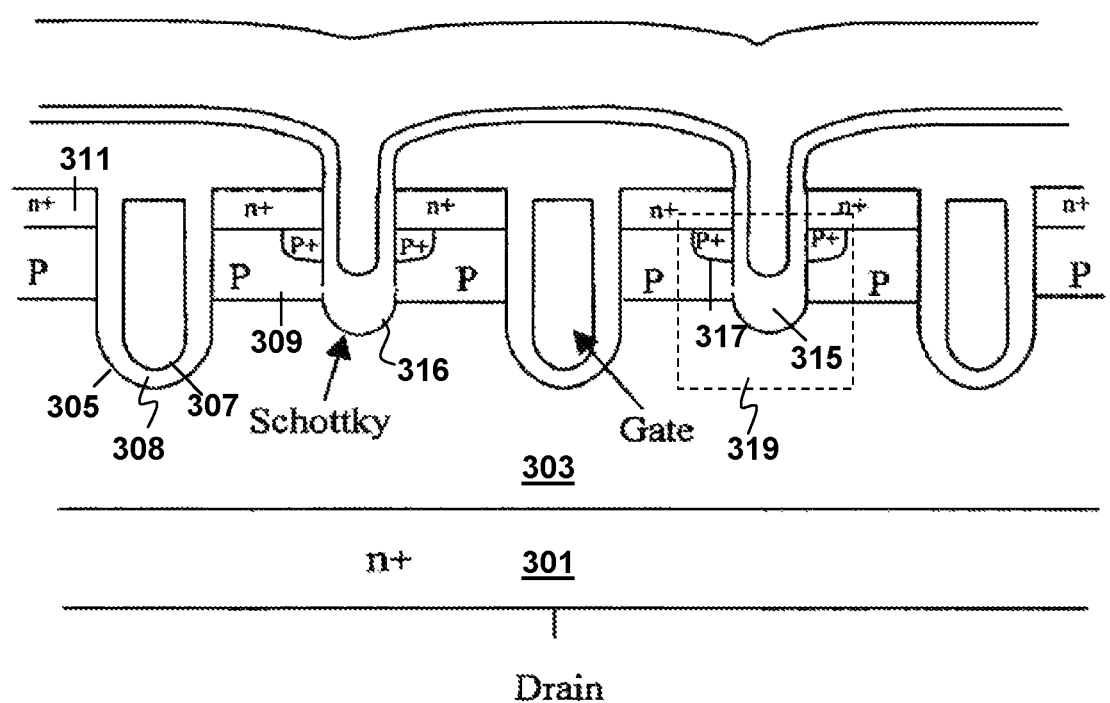

Several configurations exist for integrating a Schottky diode with a MOSFET to form a power MOSFET. These configurations, however, all suffer from certain undesirable characteristics which make them less than optimal power MOSFET devices. FIGS. 1A-1C illustrate three such prior art configurations.

FIG. 1A illustrates a prior art integrated structure with multiple MOSFET devices and a junction barrier Schottky (JBS) in parallel with those MOSFET devices. The integrated structure 100 includes an n+ type substrate 101 with an n type epitaxial layer 103. Several MOSFETs are built into the integrated structure 100. A trench 105 is fabricated into the epitaxial layer 103 and filled with conductive material 107 surrounded by an insulation layer 108 to form each gate region 107 of each MOSFET in the integrated structure 100. An area of the epitaxial layer 103 surrounding each trench is doped with p-type material to form the body region 109 of each MOSFET. Each body region 109 is doped with n+ type conductivity dopants on portions adjacent sidewalls of the trench 105 to form source regions 111 of each MOSFET device. The n+ substrate 101 provides a drain region for each MOSFET.

A junction barrier Schottky (JBS) 119 is also built into the integrated structure 100. The Schottky diode 119 includes Schottky barrier metal 115 formed directly on top of an n-doped region 113. The n− doped region 113 is formed in the epitaxial layer 103 in an area that sits between two MOSFET body regions 109. A Schottky junction is formed at the interface between the Schottky barrier metal 115 and the n-doped region 113. Thus, the barrier metal 115 forms the anode of the Schottky diode and the substrate 101 forms the cathode of the Schottky diode. Additionally, one or more p+doped shielding regions 117 may be formed within the n− doped region 113, forming P-N junctions that act to pinch-off the channel regions under the Schottky contacts to inhibit the formation of large reverse leakage currents caused by switching from forward bias to reverse bias.

While this particular configuration does indeed produce a power MOSFET device with a Schottky diode, it suffers from the disadvantage of having a reduced Schottky surface area due to the p+ shielding. For Schottky diodes with a higher breakdown voltage, a deeper p+ junction is usually required. Thus, the Schottky surface area utilization could be quite low for a high breakdown voltage JBS. The formation of the Schottky diodes requires a dedicated area in the MOSFET, resulting in a larger die.

FIG. 1B illustrates an alternative prior art integrated structure comprising a monolithically integrated Schottky diode together with a high performance trenched gate MOSFET. The integrated structure 201 includes a plurality of trenches 200-1, 200-2, 200-3, and 200-4 that are patterned and etched into an n type substrate 202. A thin layer of dielectric 204 is then formed along the walls of the trenches 200, after which conductive material 206 is deposited to substantially fill each trench 200, forming a gate region for each MOSFET of the integrated structure 201. A p-type well 208 is then formed between trenches 200, except between those trenches (e.g., 200-3 and 200-4) where a Schottky diode is to be formed. The p-type well 208 makes up the body region for each MOSFET of the integrated structure 201. N+ type source regions 212 are then formed inside p-type well regions 208. The substrate 202 forms the drain region of each MOSFET of the integrated structure 201. The N+ source regions 212 can be formed inside the p-well regions 208, either before or after the formation of P+heavy body regions 214. A layer of conductive material 216 such as titanium tungsten (TiW) or titanium nitride (TiN) may then be patterned and deposited on the surface of the substrate to make contact to N+ source junctions 212

A Schottky diode 210 is also formed within the integrated structure 201 by depositing Schottky barrier metal 218 on top of the substrate 202 in an area that does not contain a p-type well. The Schottky barrier metal 218 forms the anode of the Schottky diode 210 and the substrate forms the cathode terminal of the Schottky diode 210. The Schottky diode 210 is surrounded on both sides by MOSFET trenches 200.

This configuration resolves the issue of Schottky surface area utilization because there is no longer a need to form p-type doped regions between the Schottky barrier metal 218 and substrate 202 in order to inhibit large reverse leakage currents in the reverse biased condition. Rather, as voltage builds on the cathode of the Schottky diode, the MOSFET trenches 200-3, 200-4 surrounding the diode form a depletion region which helps reduce the diode leakage current caused by the reverse biasing. Furthermore, the distance W between the trenches 200-3, 200-4 can be adjusted such that the growing depletion regions around each trench overlap in the middle, which pinches off the drift region between the Schottky barrier metal 218 and the substrate 202.

While the integrated structure configuration in FIG. 1B better utilizes Schottky surface area, it does so at the expense of having to allocate certain undoped areas between MOSFETs solely for the formation of a Schottky diode. This involves extra processing steps during fabrication. Furthermore, this integrated structure still requires a larger-sized die, which is essentially the same disadvantage as a JBS diode.

FIG. 1C illustrates yet another integrated structure comprising a MOSFET and Schottky diode in every MOSFET cell. The integrated structure 300 includes an n+ type substrate 301 with an n type epitaxial layer 303. Several MOSFETs are built into the integrated structure 300. A trench 305 is fabricated into the epitaxial layer 303 and filled with conductive material 307 surrounded by an insulation layer 308 to form each gate region 307 of each MOSFET in the integrated structure 300. An area surrounding each trench is doped with p type material to form the body region 309 of each MOSFET. Each body region 309 is doped with n+ type conductivity material 311 on adjacent sidewalls of the trench 305 to form source regions 311 of each MOSFET device. Finally, the n+ substrate 101 provides a drain region for each MOSFET.

A Schottky diode 319 is also built into each cell of the integrated structure 300. A contact trench 316 is initially formed in the body region 309 of each MOSFET, such that the tip of the contact trench 316 extends beyond the body region 309 into the epitaxial region 303. Each contact trench 316 is filled with Schottky barrier metal 315 such that a Schottky junction is formed at the interface between the tip of the contact trench 316 and the epitaxial region 303. The Schottky barrier metal 315 lining the contact trench 316 acts as the anode of the Schottky diode 319, and the substrate 301 acts as the cathode of the Schottky diode 319. Additionally, one or more p+ doped regions 317 may be formed within the body region 309 along the sidewalls of the contact trench 316 to improve the contact to the body region.

This configuration seems to rectify the issue of surface area utilization, by eliminating the need for allocating an dedicated region between MOSFETs for the formation of a Schottky diode by integrating the Schottky diode within the MOSFET active device area (i.e., within the body region of a MOSFET device).

While the integrated structure configuration in FIG. 1C efficiently utilizes Schottky surface area and eliminates the need for reserving additional device area for the fabrication of Schottky diodes, it still suffers from undesirable characteristics. Because the Schottky barrier metal must be in direct contact with n-type material in order to properly form a Schottky diode, the contact trench created within the p-type body region must be deeper than the body junction depth. In order to obtain the desired depth for each well, additional fabrication process steps must be taken (e.g., counter doping of the body region). The complicated design scheme of this particular configuration leads to a more complex and costly fabrication process. Unfortunately, counter doping of the body region is not as well controlled in manufacturing. The contact trench depth variation also affects the Schottky characteristics.

ACCUFET Devices

Figure 2A:
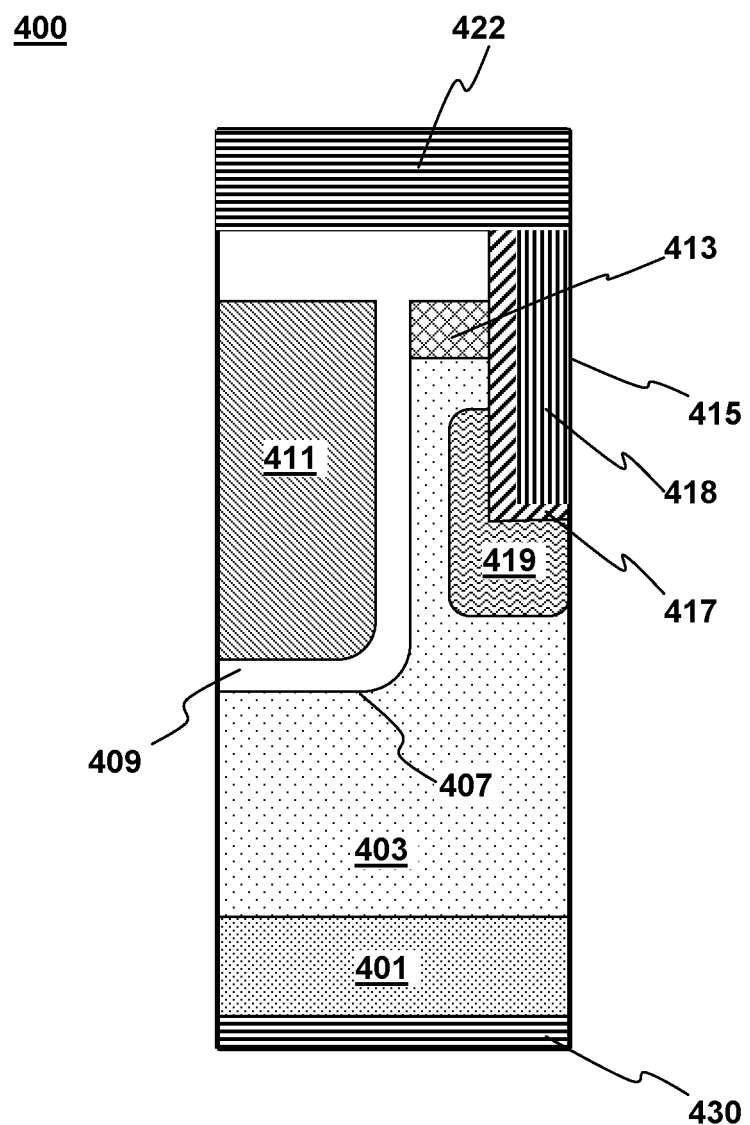
FIG. 2A is a cross-sectional schematic diagrams of an accumulation mode FET that is integrated with a MOSFET according to an aspect of the present disclosure.

FIGS. 2A-2D illustrate different views of an integrated structure 400 comprising a MOSFET device and $3^{rd}$ quadrant conduction device structure according to an aspect of the present disclosure. FIG. 2A is a cross-sectional schematic diagrams of the integrated structure 400. The integrated structure 400 comprises one or more accumulation mode FET (ACCUFET) devices, which may be connected in parallel to form a power MOSFET. An optional Schottky diode may also be included with the ACCUFET in the $3^{rd}$ dimension. The integrated structure 400 is built on a substrate 401. By way of example and not by way of limitation, the substrate may be composed of material such as silicon, silicon dioxide, aluminum oxide, sapphire, germanium, gallium arsenide (GaAs), an alloy of silicon or germanium, indium phosphide (InP) or any other material upon which electronic devices (e.g., transistors, diodes, etc.) may be deposited. By way of example, and not by way of limitation, the substrate 401 may be heavily doped to form an n+ type substrate. A drain contact 430 is electrically connected to the substrate 401 which forms the drain region for each MOSFET device.

An epitaxial layer 403 is grown on the substrate 401. By way of example, and not by way of limitation, the epitaxial layer 403 may be an n type layer. The epitaxial layer 403 may be lightly doped to support a higher device breakdown voltage but does so at the expense of increased device internal resistance.

A plurality of gate trenches 407 are then formed into the epitaxial layer 403. The trenches 407 are substantially filled with a conductive material 411 that is separated from the trench walls by a layer of dielectric material 409. The conductive material 411 filling each trench acts as a gate region for each MOSFET device. By way of example, and not by way of limitation, the conductive material may be polysilicon and the dielectric material may be silicon dioxide.

One or more contact trenches 415 are formed within the epitaxial layer 403 and each between two adjacent gate trenches 407. In addition, one or more pairs of heavily doped source regions 413 of conductivity type same as the epitaxial layer is formed in the top portion of the epitaxial layer 403, and each between the contact trench 415 and the dielectric material 409 of the gate trench 407. By way of example, and not by way of limitation, the source regions 413 may be N+ source regions. Furthermore, a heavily doped well region 419 of a conductivity type different from the epitaxial layer 403 may be formed in the epitaxial region 403 and around the bottom portion of the contact trench 415. By way of example, and not by way of limitation, the well region 419 may be a p+type well region. The P+ well region 419 may be formed by vertical implantation followed by lateral diffusion. It is noted that while the top of the p+ well region 419 could in theory go all the way to the bottom of the N+ source region 413, there are processing limitations on the p+ implant that make this impractical. An ohmic contact is formed to the source region 413 and P+ well region 419 using a standard barrier metal due to their heavy doping level, e.g., in the range of 1e19 $cm^{-3}$.

By way of example, and not by way of limitation, the barrier metal 417 may be Titanium (Ti) or Titanium nitride (TiN). In addition to the barrier metal, the contact trench 415 may be filled with a metal plug 418. By way of example, and not by way of limitation, the metal plug may be made from Tungsten (W).

A source metal 422 reaches p+ well region 419 through the contact trench 415. By way of example, and not by way of limitation, source metal can be, e.g., Al or Cu or other suitable metal.

While a lower threshold voltage is desirable, a low threshold voltage $V_{th}$ leads to higher leakage current. Thus, the limitation of lowering threshold voltage is the leakage current that the device can tolerate when it's off. Since the channel between the well region 419 and the gate trench 407 is completely depleted by the gate 411 and the nearby well region 419, a barrier can be created by engineering a gap g between the gate oxide 409 and the well region 419 to prevent leakage from the drain to the source when the device is turned off That is, in order to have a lower threshold voltage $V_{th}$, the gap g between the gate oxide 409 in the gate trench 407 and the well region 419 needs to be small. In some implementations, the horizontal width of the gap g between the gate trench 407 and the well region 419 may range from about 0.05 µm to about 0.2 µm. The length of the ACCUFET or Depleted Body MOSFET may be in a range from 0.1 µm to 0.35 µm.

Critical parameters for an ACCUFET 400 with a low $V_{th}$ are the length of the N-channel, which is defined by the vertical thickness of the well region 419, the horizontal width of the gap g between the gate oxide 409 and the well region 419, relative to the width w of a gap between the gate oxide 409 and the contact trench 415 to the well region, and the doping of epitaxial region 403 in the gap g that acts as the N-channel. By adjusting these parameters, the threshold voltage $V_{th}$ can be designed to be as low as between about 0.2V to about 0.4V.

A device according to the present disclosure may turn on and conduct much more than a conventional device with a Schottky diode. Specifically, it allows two modes of conduction in the $3^{rd}$ quadrant. Positive source bias can open the channel at low bias (about 0.3V) to allow for $3^{rd}$ quadrant conduction. Positive bias applied to gate can enable MOSFET type of conduction with extremely low $R_{ds,on}$.

Figure 2B:
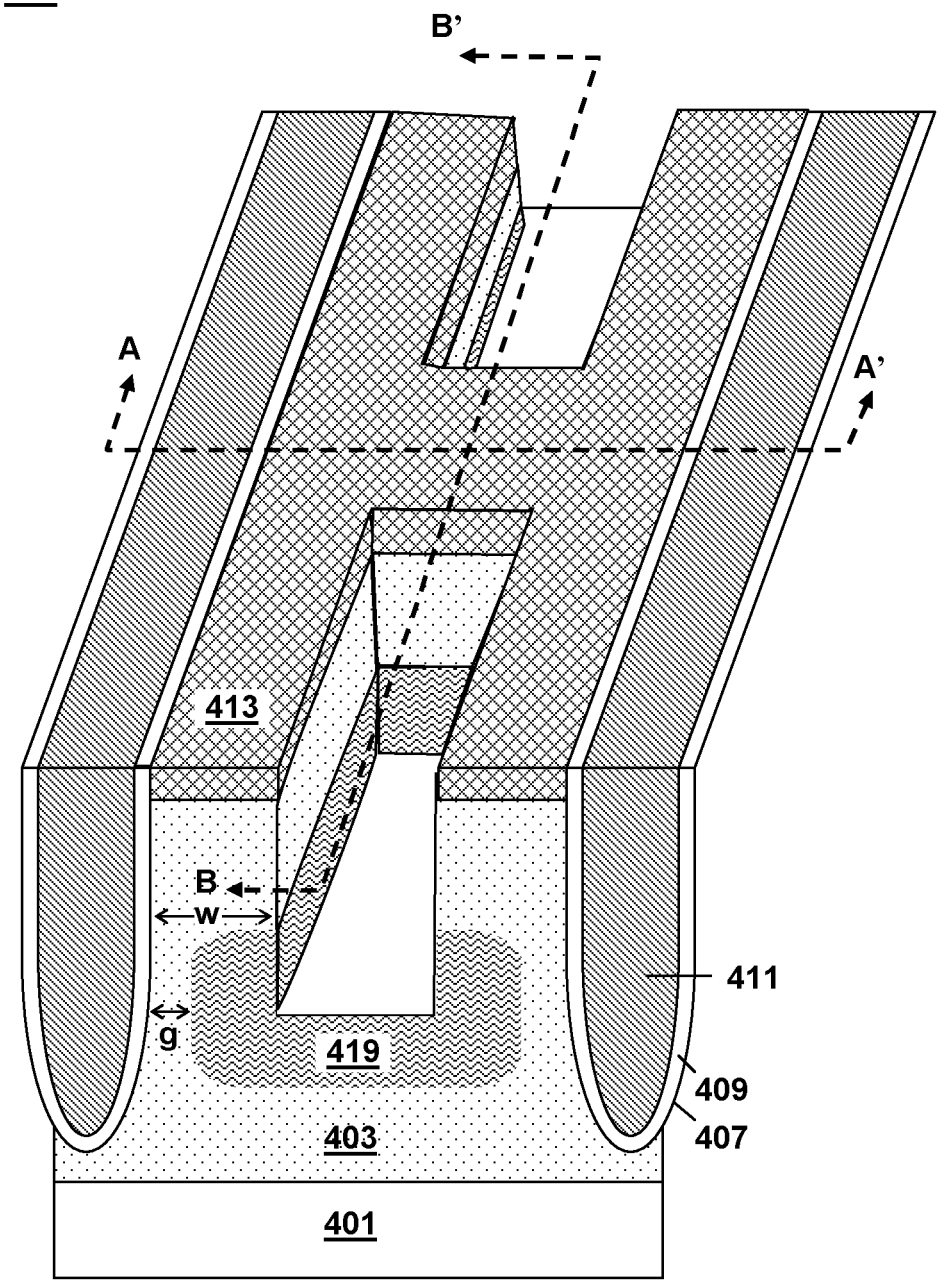
FIG. 2B is a three-dimensional view of a front portion of the integrated structure of FIG. 2A.
Figure 2C:
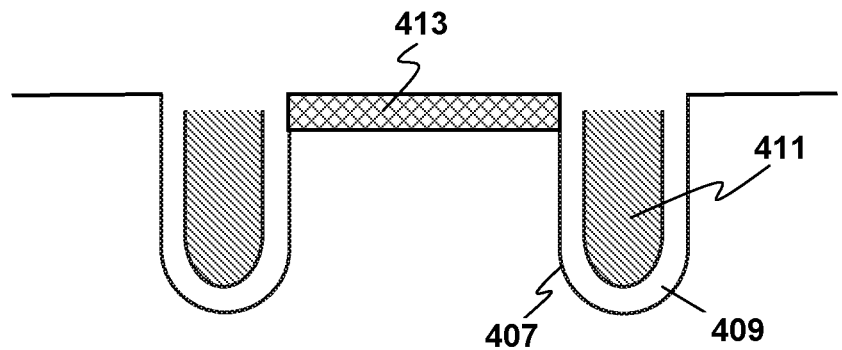
FIG. 2C is a cross-sectional view of a portion of the integrated structure along plane A-A' of FIG. 2B.
Figure 2D:
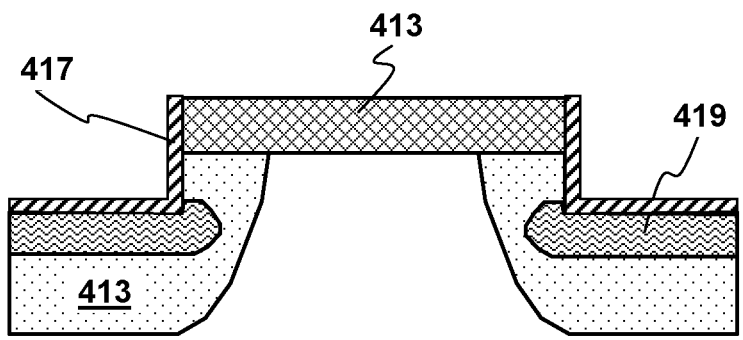
FIG. 2D is a cross-sectional view of a portion of the integrated structure along plane B-B' of FIG. 2B.

FIG. 2B provides a three-dimensional view of a front portion of the integrated structure 400 without the source metal 422 layer, the barrier metal 417 and the metal plug 418. As shown, the well region 419 is close to the gate oxide 409 in the gate trench 407 to create a barrier to prevent leakage from the drain to the source when the device is turned off FIG. 2C provides a cross-sectional view of an ACCUFET of the integrated structure 400 along plane A-A'. FIG. 2D provides a cross-sectional view of Junction FET (JFET) of the integrated structure 400 along pane B-B' with barrier metal 417 shown. As shown, a Schottky diode is formed vertically at the interface between the barrier metal 417 and the epitaxial layer 403.

Figure 2E:
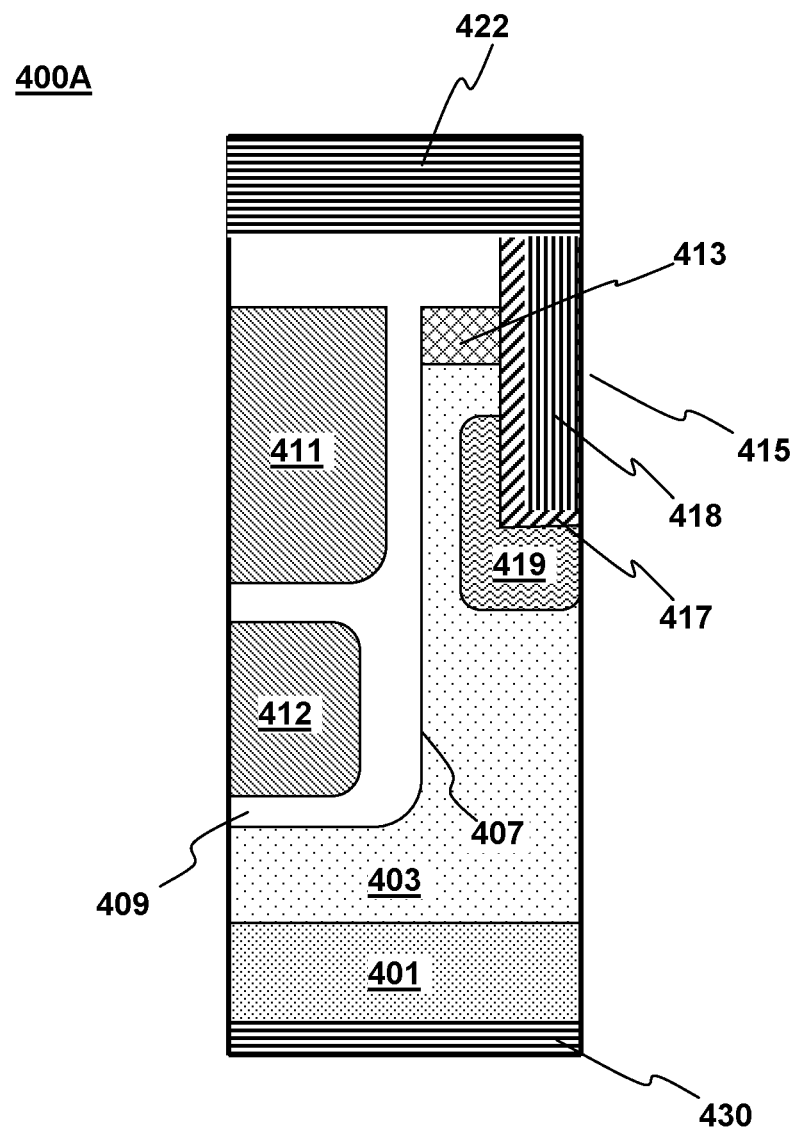
FIG. 2E is a cross-sectional schematic diagrams of a split gate transistor with an integrated ACCUFET according to an aspect of the present disclosure.

FIG. 2E is a cross sectional view of an integrated structure 400A combing a split gate transistor and an ACCUFET according to another aspect of the present disclosure. The structure 400A is similar to the structure 400, except that the gate trench includes a shield gate electrode 412 on the bottom portion and a gate electrode 411 on the top portion. It is noted that the shield electrode 412 adds extra benefits of controlling the leakage from the drain to the source.

Figure 3A:
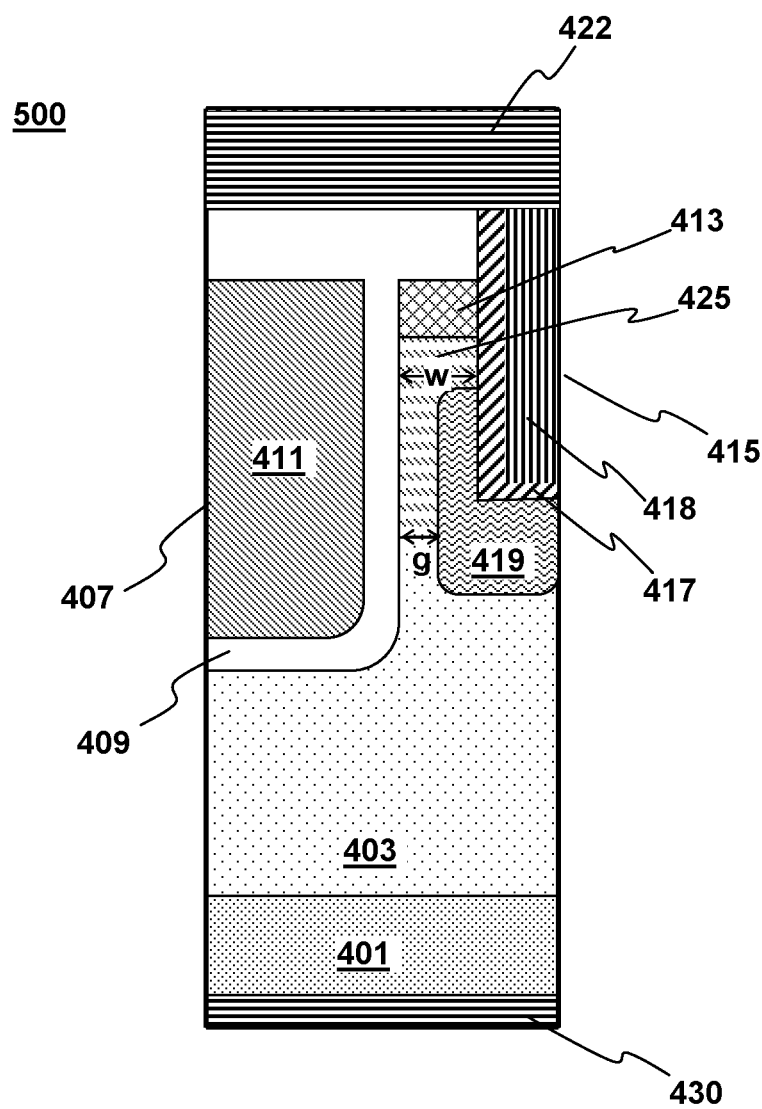
FIG. 3A is a cross-sectional schematic diagrams of a depleted channel MOSFET integrated with a MOSFET according to an aspect of the present disclosure.

MOSFET Device with Integrated Depleted Body FET for $3^{rd}$ Quadrant Conduction FIGS. 3A-3D illustrate different views of an integrated structure 500 comprising a MOSFET device and depleted body MOSFET according to an aspect of the present invention. It is noted that the terms "depleted body MOSFET", "depleted body FET", "depleted channel MOSFET", and "depleted channel FET" are used interchangeably by those skilled in the art and herein to refer to the same structure. FIG. 3A is a cross-sectional schematic diagrams of the integrated structure 500. The integrated structure 500 comprises one or more depleted channel FET devices which may be connected in parallel to form a power MOSFET. An optional Schottky diode in the $3^{rd}$ dimension may also be included with the depleted body FET and MOSFET.

The structure 500 is similar to the structure 400 of FIG. 2A except that a lightly doped region 425 of a conductivity type different from the epitaxial layer is provided between the source region 413 and the epitaxial region 403 and between the gate trench 407 and the well region 419. By way of example, and not by way of limitation, the lightly doped region 425 may be a P type region.

In addition to the parameters mentioned above, critical parameters for the integrated structure 500 combing a depleted channel MOSFET with a low threshold voltage include the doping of the lightly doped region 425, which may be in the range of 1e16 cm$^{-3}$ to 1e17 cm$^{-3}$. The P+ well 419 may have a doping concentration in the range of 5e18 cm$^{-3}$ to 1e19 cm$^{-3}$.

Figure 3B:
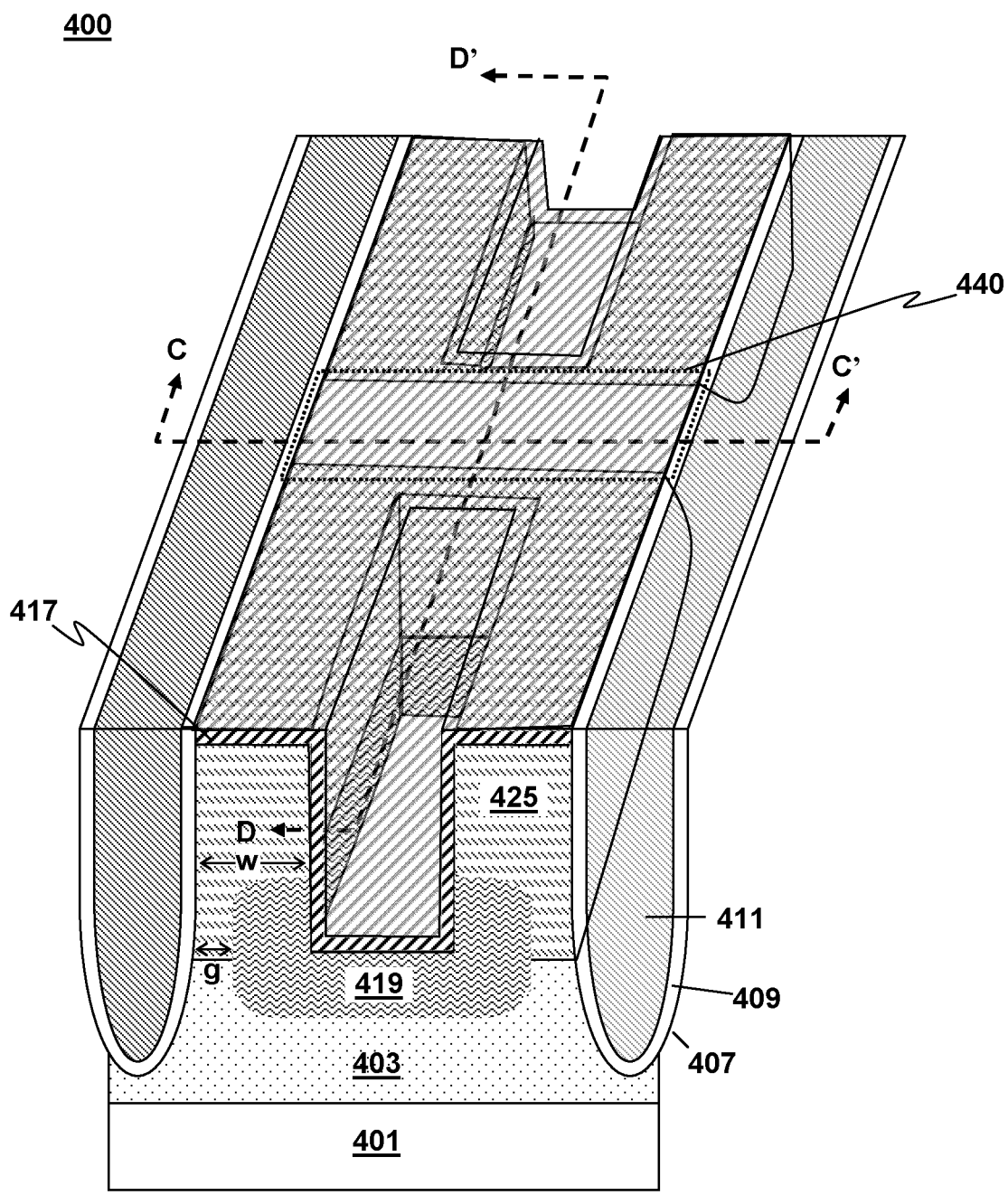
FIG. 3B is a three-dimensional view of a front portion of the integrated structure of FIG. 3A.
Figure 3C:
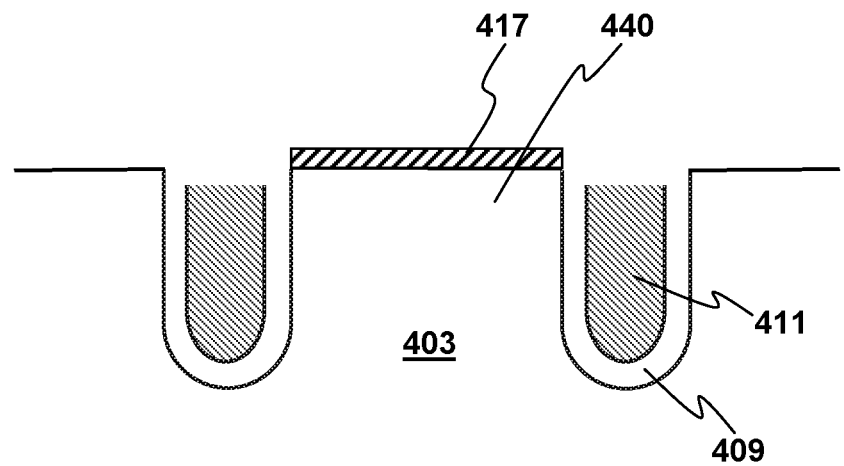
FIG. 3C is a cross-sectional view of a portion of the integrated structure along plane C-C' of FIG. 3B.
Figure 3D:
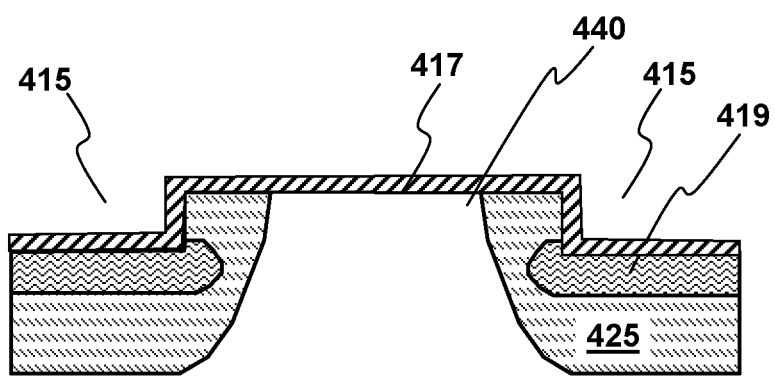
FIG. 3D is a cross-sectional view of a portion of the integrated structure along plane D-D' of FIG. 3B.

FIG. 3B provides a three-dimensional view of a Schottky portion of the integrated structure 500 without the source region 413 and metal plug 418. Additionally, FIG. 3B shows, under the barrier metal 417, there is a mesa 440 formed in semiconductor epitaxial layer 403 between two gate trenches where there is no doped well region 419. Depending on the cutline, two different types of Schottky diode may be formed vertically by a barrier metal. Specifically, as shown in FIG. 3C, a trench MOS barrier Schottky (TMBS) is formed vertically at mesa 440. In a TMBS, charge coupling between majority charge carriers in mesa 440 and conductors on the sidewalls of the gate trenches changes the electric field profile under the Schottky contact which reduces reverse leakage current and improves breakdown properties. Furthermore, as shown in FIG. 3D a Junction barrier Schottky (JBS) may be formed vertically to the mesa 440 between the lightly doped regions 425 and the contact trenches 415.

Figure 3E:
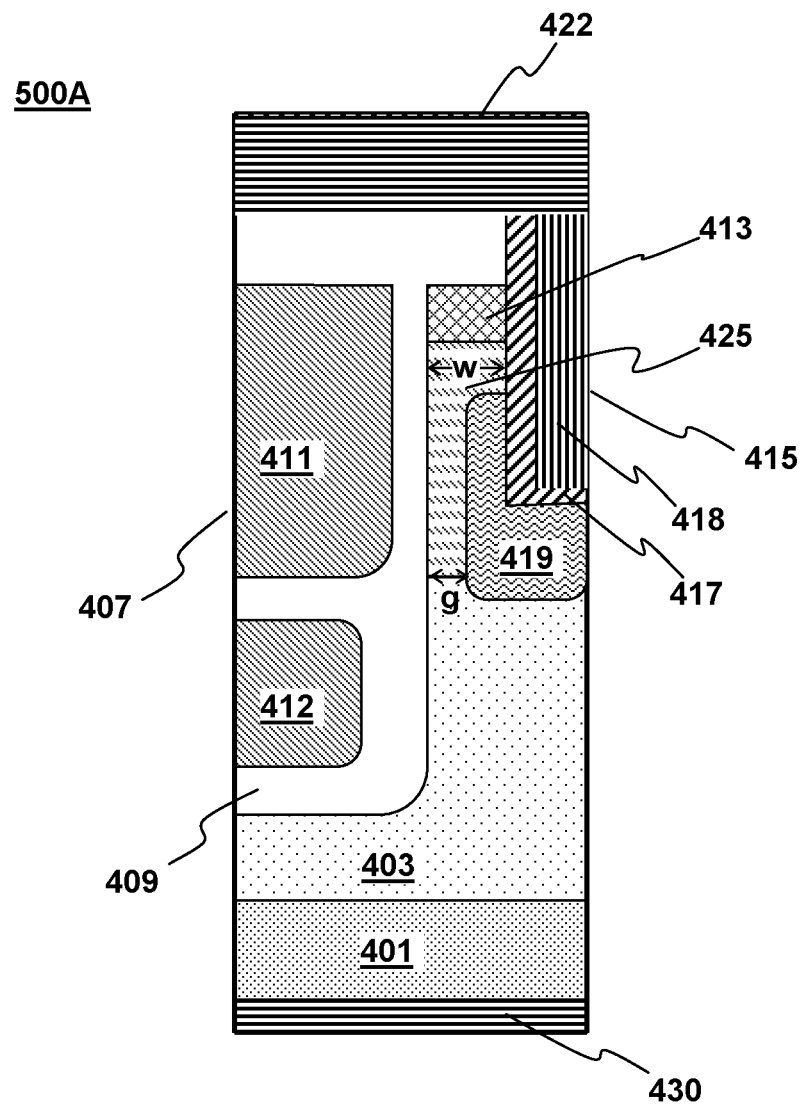
FIG. 3E is a cross-sectional schematic diagrams of a split gate transistor with an integrated depleted Body FET according to an aspect of the present disclosure.

FIG. 3E is a cross sectional view of an integrated structure 500A combing a split gate transistor and a Schottky diode according to another aspect of the present disclosure. The structure 500A is similar to the structure 500, except that the gate trench includes a shield gate electrode 412 on the bottom portion and a gate electrode 411 on the top portion.

Figure 4A:
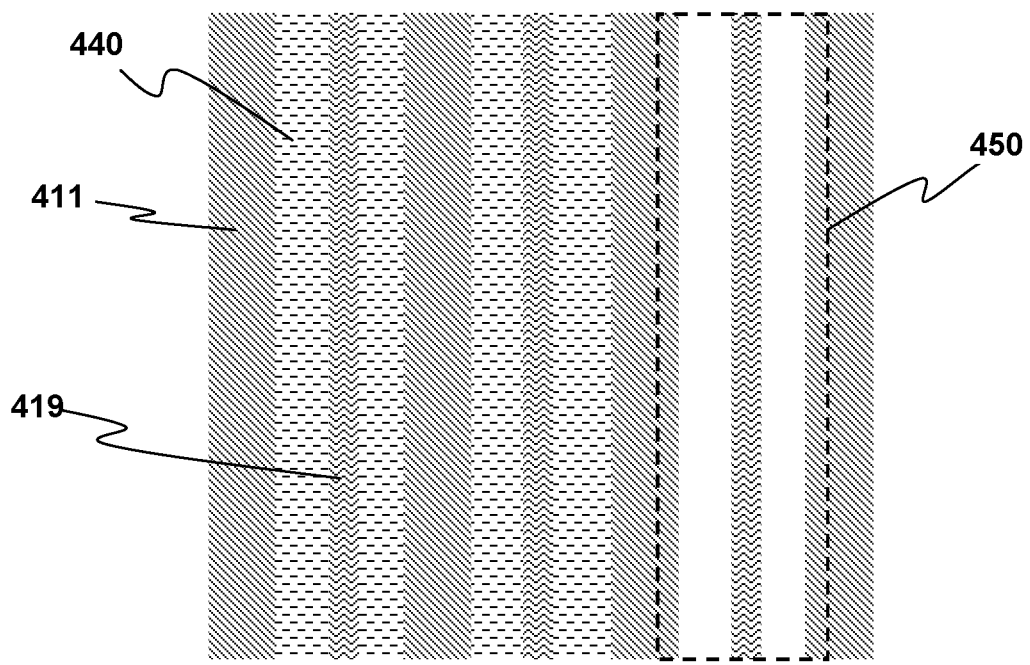
FIGS. 4A-4D are top views of a power MOSFET with integrated ACCUFET or Depleted Body MOSFET according to aspects of the present disclosure.
Figure 4B:
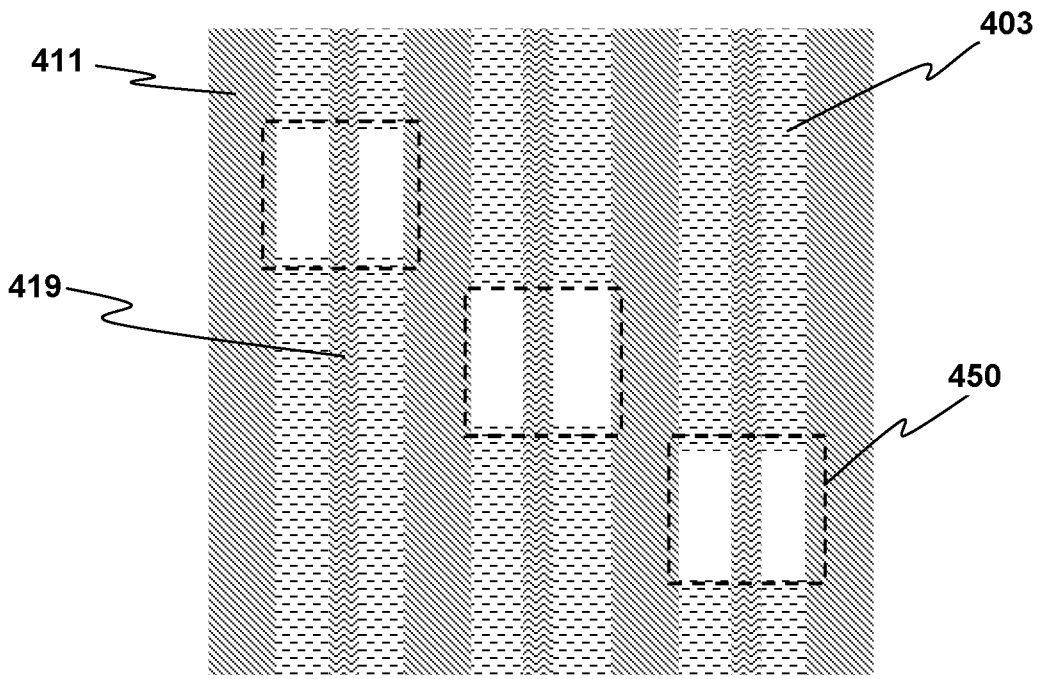
Figure 4C:
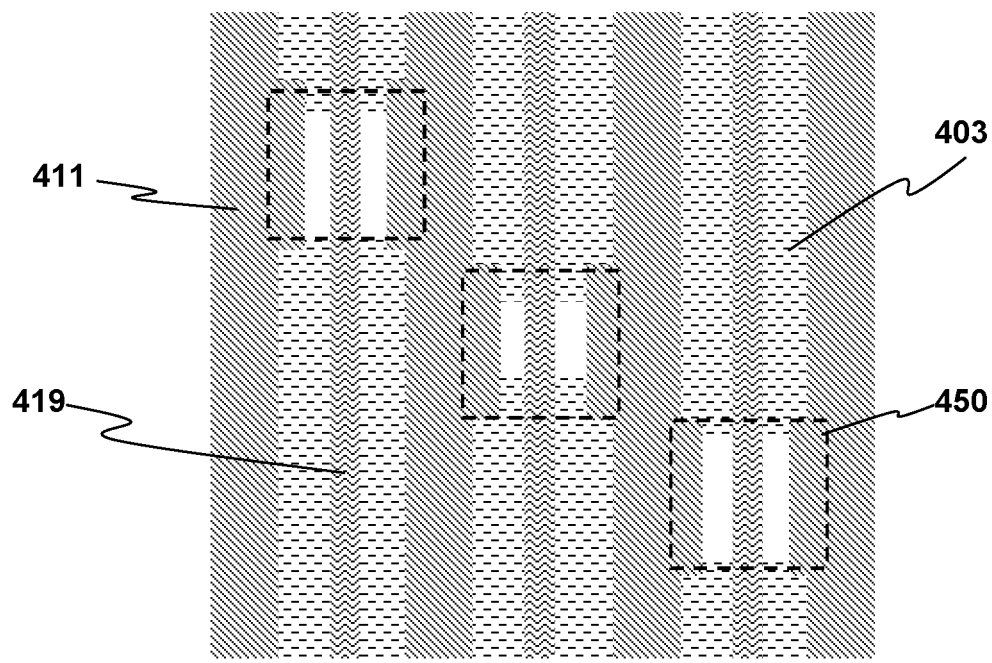
Figure 4D:
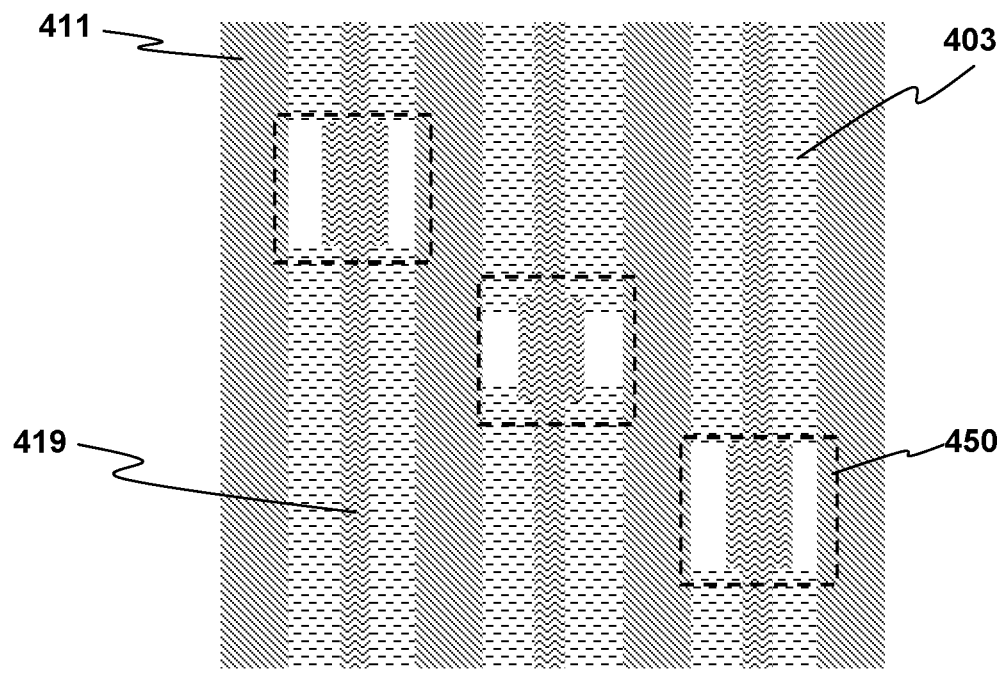

There are a number of possible ways in which ACCUFETs or Depleted Body MOSFETs diodes may be integrated with power MOSFET devices. By way of example, and not by way of limitation, FIGS. 4A-4D depict top plan views of power MOSFETs according to aspects of the present disclosure. A well region 419 is provided between the gate regions 411. Most of the area except for regions 450 is regular MOSFET region with p-body 440. Regions 450 are the regions without p-body 440 to create ACCUFET according to an aspect of the present disclosure. In order to narrow the gap between the well region 419 and the gate oxide 409, the trench layout may be adjusted to become wider at the regions 450 where the ACCUFET is formed as shown in FIG. 4C or the contact layout may be adjusted as shown in FIG. 4D.

Although the present invention has been described in terms of the presently preferred embodiment, it is to be understood that such disclosure is not to be interpreted as limiting. For example, although n-channel devices are described above, aspects of the present disclosure can be implemented as p-channel devices as well simply by reversing the conductivity types of the doped regions described above. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method, comprising:
   forming a plurality of gate trenches into an epitaxial region of a first conductivity type over a semiconductor substrate of the first conductivity type;
   substantially filling each trench with a conductive material that is separated from trench walls by a layer of dielectric material to form a gate;

forming one or more contact trenches into the epitaxial region, each contract trench being located between two adjacent gate trenches;

forming a heavily doped well region of a second conductivity type in the epitaxial region opposite to the first conductivity type proximate a bottom portion of each of the one or more contact trenches, wherein a horizontal width between the heavily doped well region and a gate trench of the plurality of gate trenches is about 0.05 μm to about 0.2 μm;

forming one or more heavily doped source regions of the first conductivity type in a top portion of the epitaxial region, each provided between a corresponding one of the contact trenches and a corresponding one of the gate trenches; and forming a barrier metal over a mesa in a portion of the epitaxial region in which there are no heavily doped source regions, wherein the mesa is formed between two of the contact trenches and two lightly doped regions of the second conductivity type.

2. The method of claim 1, wherein each gate trench has a gate region in an upper portion of the gate trench and a shield gate region in a lower portion of the gate trench.

3. The method of claim 2, wherein the first conductivity type is N-type and the second conductivity type is P-type.

4. The method of claim 1, wherein the first conductivity type is P-type and the second conductivity type is N-type.

5. The method of claim 1, further comprising forming one or more lightly doped regions of the second conductivity type are provided in the epitaxial region, wherein the one or more lightly doped regions of the second conductivity type include a particular region formed between one of the heavily doped well regions and one of the gate trenches, wherein the particular region extends to a depth between a bottom portion of the heavily doped well region and a bottom of a nearby one of the contact trenches.

6. The method of claim 1, wherein the epitaxial region has a doping concentration of about $1e16 cm^{-3}$ to about $5e16 cm^{-3}$.

7. The method of claim 1, wherein the lightly doped regions of the second conductivity have a doping concentration of about $5e16 cm^{-3}$ to about $1e17 cm^{-3}$.

8. The method of claim 1, further comprising adjusting a horizontal width of a gap between the heavily doped well region and the gate trench by widening some of the gate trenches.

* * * * *